United States Patent [19]
Jones

[11] 3,962,530
[45] June 8, 1976

[54] HIGH-VOLTAGE LIQUID-COOLED APPARATUS AND SUPPLY LEADS THEREFOR

[75] Inventor: David William Jones, Liverpool, England

[73] Assignee: Triplex Safety Glass Company Limited, London, England

[22] Filed: Oct. 1, 1974

[21] Appl. No.: 510,965

[30] Foreign Application Priority Data
Oct. 11, 1973 United Kingdom............... 47582/73

[52] U.S. Cl. .............................. 174/15 C; 174/15 R
[51] Int. Cl.² ........................................... H01B 7/24
[58] Field of Search .................. 174/15 R, 15 C, 19, 174/20, 21 R, 21 C, 22 R, 74 R

[56] References Cited
UNITED STATES PATENTS
2,483,301  9/1949  Roberds................................ 174/15

FOREIGN PATENTS OR APPLICATIONS
596,392  5/1934  Germany .............................. 174/19
44-13338  9/1969  Japan..................................... 174/19
648,558  1/1951  United Kingdom................... 174/19
1,025,628  4/1966  United Kingdom................ 174/15 C

*Primary Examiner*—Arthur T. Grimley
*Attorney, Agent, or Firm*—Sughrue, Rothwell, Mion, Zinn & Macpeak

[57] ABSTRACT

In a high-voltage, liquid-cooled apparatus having at least one component, such as a cathode element of a reactive sputtering apparatus, which is connected both to a source of high voltage and a supply of cooling liquid, an electrical conductor for carrying the high voltage is accommodated with a cooling liquid supply pipe of insulating material. The conductor may be a wire or wire braid lying in the liquid supply pipe or a metal tube fitting closely within an outer electrically insulating sheath of the liquid supply pipe. Better contacts at the connectors and a reduced incidence of insulation breakdown can thus be achieved.

8 Claims, 6 Drawing Figures

HIGH-VOLTAGE LIQUID-COOLED APPARATUS AND SUPPLY LEADS THEREFOR

CROSS-REFERENCE TO RELATED APPLICATION

This Application relates to a feature which is particularly applicable to the apparatus disclosed in U.S. Application Ser. No. 220,899, filed Jan. 26, 1972.

BACKGROUND OF THE INVENTION

1. Field of the Invention

This invention relates to high voltage liquid-cooled apparatus and supply leads therefor and to sputtering apparatus.

2. Description of the Prior Art

Problems can arise in the operation of high voltage apparatus due to electrical breakdown in high tension leads. Such problems are particularly prevalent in cases where the high tension leads are subject, in operation of the apparatus, to conditions of high temperature and low ambient pressure.

For example, in U.S. Application Ser. No. 220,899 there is disclosed a reactive sputtering apparatus for sputtering a film of metal oxide on to the surface of a substrate, e.g. a sheet of glass. The sputtering apparatus comprises a vacuum chamber in which there are means for supporting a substrate on to whose surface a film of metallic oxide is to be sputtered. A cathode assembly is arranged in the vacuum chamber in the vicinity of the substrate, the cathode assembly comprising a series of spaced, parallel cathode strips. The surfaces of the cathode strips which face the surface of the substrate which is to be coated are formed from the metal whose oxide is to be sputtered. Each of the cathode strips has an earthed electrostatic shield which surrounds and is spaced from the cathode strip on all sides except for the sputtering surface of the cathode strip. Radiant heating means are provided in the vacuum chamber for maintaining the substrate at a desired elevated temperature during the sputtering process.

Each of the cathode strips is hollow so as to provide a water cooling of the cathode assembly. Water is fed into the first cathode strip of the cathode assembly through a flexible inlet pipe leading through the wall of the vacuum chamber. The water is passed from the first cathode strip into the next through a further flexible pipe, each of the cathode strips being connected with the preceding cathode strip in this manner. The water leaves the last cathode strip of the cathode assembly through a flexible outlet pipe which is taken out through the wall of the vacuum chamber. In an alternative arrangement, applicable to equipment of larger size, each of the cathode strips of the cathode assembly may be provided with individual inlet and outlet water pipes leading through the wall of the vacuum chamber. The water pipes are of a plastics material such as polytetrafluoroethylene (PTFE) or nylon, and are connected directly with the cathode strips by standard union couplings, usually made of brass.

Means are provided for supplying a sputtering atmosphere of oxygen and another gas or gases (e.g. argon) at reduced pressure into the vacuum chamber. Sputtering of the oxide of the cathode metal on to the surface of the substrate is obtained by applying a high negative potential to the cathode strips of the cathode assembly. Electrical connection to the cathode strips has hitherto been made by high tension leads of the co-axial cable type. A main lead may be provided connecting with the first cathode strip of the cathode assembly, the other cathode strips being connected one with another by short bridging leads. Each of the high tension leads may be connected with its respective cathode strip by a standard co-axial plug type connector. The centre conductor of the lead, carrying the high negative potential, is connected with the central socket of the connector which is a push fit with a connector pin on the cathode strip. The outer conductor of the lead is earthed and connected with the sheath of the connector, which is screwed on to the uncooled electrostatic shield of the cathode strip.

Usually the water connectors to the cathode strips give very few problems in operation compared with the connectors for the high tension leads. Problems arise with the connectors for the high tension leads due to three basic reasons:

1. Because of the need to heat the substrate to an elevated temperature (e.g. 300° to 350°C) in carrying out the sputtering process, everything in the vacuum chamber which is not water cooled also becomes hot. In particular, the electrostatic shield of the cathode strips and hence the connectors for the high tension leads which are coupled with the electrostatic shields through the sheaths of the connectors becomes very hot. At the high temperature involved, the insulation between the earthed shield and both the central socket of the high tension connectors and the centre conductor of the high tension lead becomes prone to electrical breakdown at the high voltages involved.

2. Because the electrical contact in the high tension connectors is by means of a push fit of the central socket of the connectors with the pins on the cathode strips, the contact is poor, and loss of resilience with temperature of the sockets in the connectors, plus dirtying by oxidation, makes contact even worse.

3. The gas pressure in the vacuum chamber is set to promote a sputtering discharge from the cathode strips. Naturally this also tends to encourage such a discharge between any other high tension point and the nearer earthed points. Such discharges occur in the high tension connectors between the central pin and socket and the earthed sheath of the connectors. This causes transfer of conducting material to the connector insulation as well as carbonising it through heating.

All these factors tend to cause breakdown of the connector insulation, first by coating and carbonisation, and then by electrical conduction across this pathway, which accelerates carbonising to cause complete failure very rapidly once initiated.

Similar problems can occur in other types of high voltage apparatus where the connectors become hot in operation.

SUMMARY OF THE INVENTION

This invention has for its object the reduction elimination of such problems in apparatus in which components having to be maintained at a high voltage are provided with liquid cooling means.

According to the invention, in a high voltage liquid-cooled apparatus comprising at least one component which is arranged to be connected both to a source of high voltage and to a supply of cooling liquid, an electrical conductor for carrying the high voltage is accommodated within a cooling liquid supply pipe of electrically insulating material.

Preferably the cross-sectional area of the electrical conductor is substantially less than that of the interior of the liquid supply pipe, so as not unduly to restrict the flow of cooling liquid through the liquid supply pipe.

The electrical conductor may be a metal wire or wire braid lying loosely in the liquid supply pipe. The wire or wire braid may be bare, or a wire having an insulating sheath of plastics material may be used. Alternatively, the electrical conductor may be a metal tube forming a conductive inner lining fitting tightly within an outer electrically insulating sheath of the liquid supply pipe.

In a preferred arrangement, one end of the liquid supply pipe is connected to the component by means of a metal union and the electrical conductor projects beyond the end of the electrically insulating material of the liquid supply pipe and is connected to a metal part of the union. When using a wire or wire braid conductor as described above, the union may then comprise a metal ferrule receiving the said end of the liquid supply pipe and clamped between oppositely facing clamping surfaces provided on a stub member and on a cap nut screw-threaded on the stub member, the conductor wire or wire braid being connected to the ferrule by soldering or brazing. Alternatively, when using a metal tube as conductor, as mentioned above, the union may comprise a metal coupling ring of convex annular (i.e. part spherical) form clamped between oppositely facing clamping surfaces provided on a stub member and on a cap nut screw-threaded on the stub member so as to cause the coupling ring to make sealing engagement with the portion of the metal tube which projects beyond the end of the electrically insulating sheath of the liquid supply pipe. In the latter case, the end of the electrically insulating sheath of the liquid supply pipe preferably fits tightly within an annular recess in an extension on the cap nut, with the interposition of an O-ring seal.

Preferably the end of the electrically insulating liquid supply pipe remote from the component is connected to one end of a double-ended metal union the other end of which is connected to a further liquid supply pipe from a main cooling liquid supply, and the electrical conductor projects beyond the end of the electrically insulating material of the first liquid supply pipe and is connected to a metal part of the double-ended union, which is in turn arranged to be connected to the high-voltage source.

According to another aspect of the invention, a reactive sputtering apparatus, for sputtering a film of a metallic compound on to the surface of a substrate, comprises a vacuum chamber in which there are means for supporting a substrate on to whose surface a film of the metallic compound is to be sputtered, a cathode assembly arranged in the vacuum chamber in the vicinity of the substrate, the cathode assembly comprising a series of spaced parallel hollow cathode strips, the surfaces of the cathode strips which face the surface of the substrate which is to be coated being formed from the metal whose compound is to be sputtered, radiant heating means being provided in the vacuum chamber for maintaining the substrate at a desired elevated temperature during the sputtering process, the cathode strips being connected with a supply of cooling liquid by cooling liquid supply pipes of electrically insulating material, and the cathode strips being connected with a source of high voltage by an electrical conductor passing through the cooling liquid supply pipes.

The invention also resides in a combined lead for carrying electrical and cooling liquid supplies to a component of a high-voltage liquid-cooled apparatus, e.g. a reactive sputtering apparatus, said lead comprising an electrical conductor for carrying the high voltage, accommodated within a cooling liquid supply pipe of electrically insulating material, each end of the liquid supply pipe being fitted with a metal union for attachment to the component and to a mains supply arrangement, respectively, the electrical conductor projecting beyond the electrically insulating material of the liquid supply pipe at each end thereof and being connected to a metal part of each union.

DETAILED DESCRIPTION OF THE INVENTION

Figure 1:
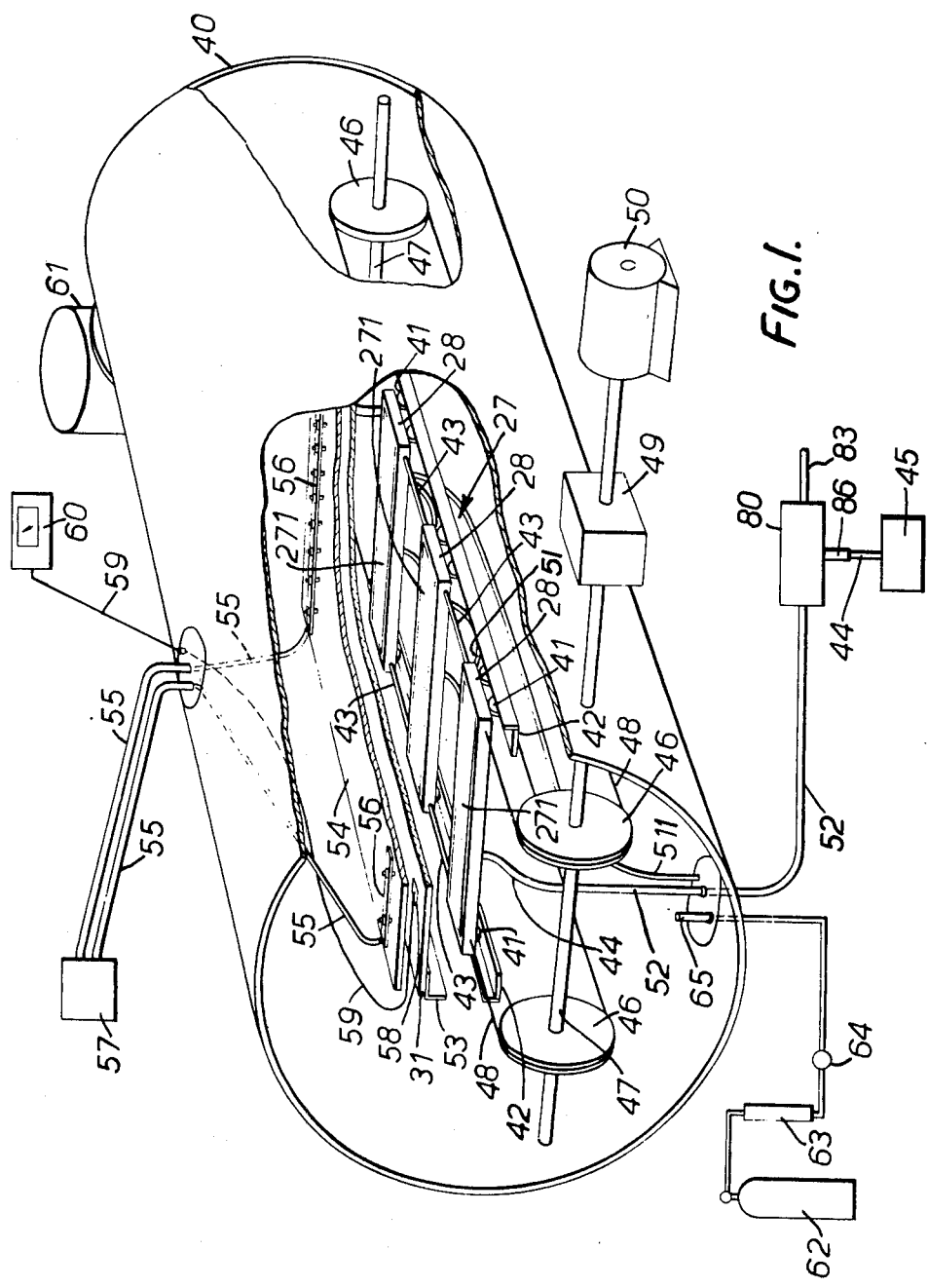
FIG. 1 is a perspective view of a reactive sputtering apparatus.

FIG. 1 illustrates a reactive sputtering apparatus which comprises a cylindrical vacuum vessel 40 which removable vacuum-tight end closures (not shown). A cathode assembly 27 comprises a plurality of spaced, parallel sections or strips 271 having upper surfaces of an indium/tin alloy. Each strip 271 has an earthed electrostatic shield 28. Only three sections or strips 271 are shown in FIG. 1 for clarity. In practice, the number of strips used will depend on the length of the substrate to be coated, being generally chosen so that an oscillation having an amplitude equal to the spacing between the centre lines of the strips will cause all parts of the substrate to be covered. The strips 271 are mounted on pairs of rollers 41 at each of their ends, and these rollers run on horizontal guide rails 42 secured to opposite side of the vessel 40. The strips 271 are connected to one another by adjustable link rods 43 which maintain their spacing and parallel alignment with one another and ensure that all the strips can move together along the guide rails in the direction perpendicular to their length, A pair of pulleys 46 is mounted on a transverse shaft 47 at each end of the vessel 40, and a pair of traction wires or cables 48 connected at each end to the electrostatic shields 28 of the end strips 271 are led over the pulleys to form drive means. One of the shafts 47 passes through the wall of the vessel 40 and is connected via a variable amplitude oscillatory motion device 49 to an electric motor 50.

Figure 2:
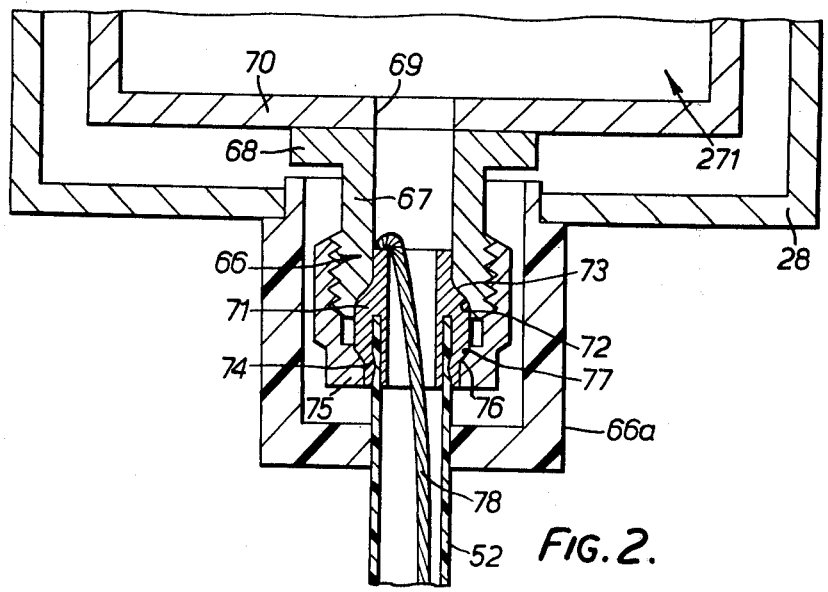
FIG. 2 is a detail cross-section of a cathode strip of the apparatus of FIG. 1 showing the water cooling and electrical connections to the cathode strip.

Each of the strips 271 is hollow, its interior being filled with cooling water. Water is supplied to the first of the strips 271 through a flexible inlet pipe 52 which passes through the wall of the vacuum vessel 40 and is connected with the underside of the first strip 271 near one end thereof, as shown in FIG. 2 or in FIG. 5. A flexible pipe 51 connects the other end of the first strip 271 with the adjacent end of the centre strip 271. A similar pipe 51 connects the other end of the centre strip 271 with the adjacent end of the last strip 271. A further outlet pipe 511 leads from the other end of the last strip 271 and passes out through the wall of the vacuum vessel 40. Thus the pipes 52, 51 and 511 pass the cooling water through the strips 271 in series.

Above the horizontal guide rails 42, a pair of horizontal support rails 53 (only one of which is shown) are secured to opposite sides of the vessel 40 to support the substrate 31 which is to be provided with a transparent conducting film.

Above the position of the substrate 31, a radiant heater 54 is secured in the vessel 40, fed through low tension leads 55 and bus bars 56 from a low voltage power unit 57. The heater 54 extends over the whole area of the substrate 31.

A thermocouple 58 is placed on the upper surface of the substrate 31 and is connected through leads 59 to a calibrated dial instrument 60 to indicate the temperature of the substrate.

A vacuum pump (not shown) is connected to the interior of the vessel 40 through an exhaust connection 61, and a gas supply 62 of the selected atmosphere is connected through a flow meter 63 and needle valve 64 to an inlet 65 opening into the vessel. The inlet 65 is at the opposite end of the vessel 40 from the exhaust connection 61 so that gas flow from inlet to exhaust tends to pass through the working space between the cathode assembly and the substrate and thereby assists in maintaining uniformity of the oxygen concentration in the working space.

As shown in FIG. 2, the flexible water inlet pipe 52, which is of electrical insulating material, such as polytetrafluoroethylene (PTFE) or nylon, is connected with the first of the cathode strips 271 by a standard brass union 66, which comprises a tubular stub member 67 having an end flange 68 by which the stub member 67 is welded to the base plate 70 of the cathode strip 271 in register with an aperture 69. A brass sealing ferrule 71 in the union 66 has a conical face 72 which seals against a conical seating 73 in the bore of the stub member 67. The end of the pipe 52 fits in a coaxial annular recess 74 in the ferrule 71, which is held by a cap nut 75 screwed on to the stub member 67. The cap nut 75 has an internal conical face 76 which bears against an external conical face 77 in the ferrule 71, so as to clamp the end of the pipe 52 on the annular recess 74 in the ferrule 71.

A PTFE cap member 66a is fitted over the union 66, forming a seal between the electrostatic shield 28 and the inlet pipe 52. The cap member 66a prevents sputtering of material from the union 66 into the atmosphere of the vacuum vessel 40.

A high tension lead in the form of a length of copper wire braid 78 is threaded through the pipe 52. The end of the braid 78 is soldered to the end of the ferrule 71 inside the union 66.

Figure 3:
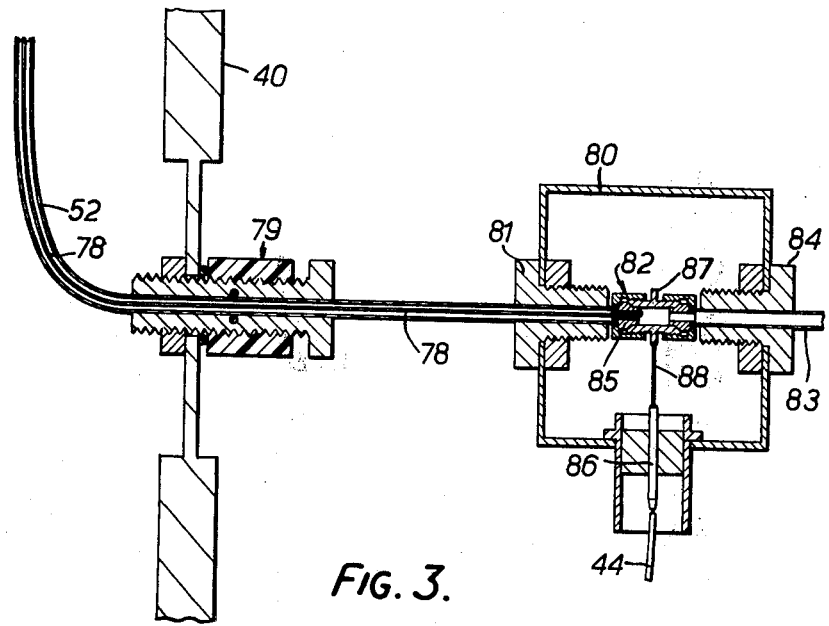
FIG. 3 is a detail section view of the water cooling and electrical connections from the mains supplies to the apparatus of FIG. 1.

As shown in FIG. 3, the pipe 52 passes through a PTFE seal 79 in the wall of the vacuum vessel 40 and then enters a conduit box 80 through a bushing 81 in one face of the conduit box 80. Inside the conduit box 80 the end of the pipe 52 is connected with one end of a straight water union 82. This union 82 is similar to the union 66 as shown in FIG. 2, but is double-ended. A water pipe 83 which is also of PTFE or nylon leads from a water main and enters the conduit box 80 through another bushing 84 in the face of the conduit box 80 opposite to the bushing 81. The end of the pipe 83 is connected with the end of the union 82 opposite to the pipe 52.

The copper braid 78, which leads through the pipe 52, is soldered to a brass sealing ferrule 85 which seals the end of the pipe 52 in the union 82, the ferrule 85 being similar to the ferrule 71 in the union 66.

A flexible high tension lead 44 from the negative terminal of a high voltage source 45 (shown in FIG. 1) is of co-axial cable type, the outer conductor being earthed and connected to the conduit box 80 by the outer sleeve of a standard co-axial connector 86. The central conductor of the lead 44 is connected with the body 87 of the union 82 through the pins of the connector 86 and a copper lead 88 which is soldered to the body 87 of the union 82.

Figure 6:
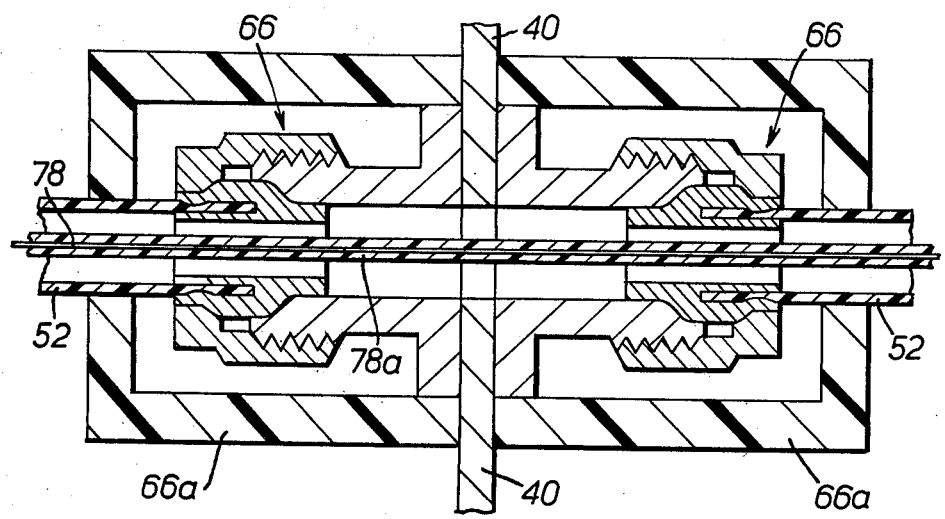
FIG. 6 is a detail sectional view showing an alternative arrangement for passing the water cooling and electrical connections through the wall of the chamber enclosing the apparatus.

FIG. 6 shows an alternative arrangement to the PTFE seal 79 by means of which the high tension lead of wire braid 78 is passed through the wall of the vacuum vessel 40. In the arrangement of FIG. 6, two standard brass unions 66 are welded, or brazed, on either side of an aperture in the wall of the vacuum vessel 40. The part of the water inlet pipe 52 leading from the conduit box 80 connects with the union 66 on the outside of the vacuum vessel 40, whilst the part of the pipe 52 inside the vacuum vessel 40 leads from the union 66 on the inside of the vacuum vessel 40. The high tension lead 78 which is threaded through the pipe 52 is in the form of a length of copper wire or braid which is sheathed in a plastics material 78a to insulate the wire or braid from the unions 66 and the wall of the vacuum vessel 40. Cap members 66a are provided as in FIG. 2. If desired, the conduit box 80 of FIG. 3 could be substituted by a box (not shown) having an open side by which it is attached to the outside of the vessel 40 so as to enclose the outer union 66 of FIG. 6, to which the high tension lead 88 is then soldered.

Figure 4:
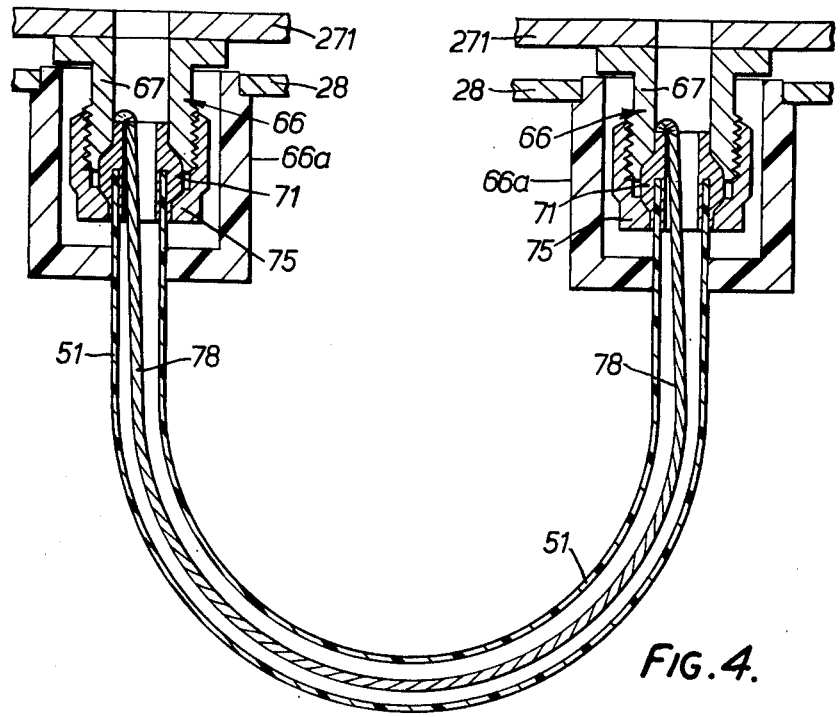
FIG. 4 is a sectional detail view showing the connections between two adjacent cathode strips.

The pipes 51 which connect the adjacent cathode strips 271 in the cathode assembly are also of PTFE or nylon. As shown in FIG. 4, the two ends of each pipe 51 are connected with the respective cathode strips 271 by unions 66 similar to the union 66 illustrated in FIG. 2. A copper braid 78 leading through each pipe 51 is soldered at its end to the sealing ferrules 71 in the two unions 66, thus connecting the adjacent cathode strips 271 one with another electrically.

In use, when the substrate 31 has been placed on the support rails 53 and the end closures have been sealed, the vessel 40 is evacuated through the exhaust connection 61 and the selected sputtering atmosphere is supplied through the inlet 65, while the substrate is heated to the desired temperature by the heater 54. The cathode assembly 27 comprising the strips 271 is oscillated back and forth along the guide rails 42 by the motor 50 and the high negative voltage is applied to the strips 271 by the source 45. The vessel 40 and rails 42, 53, as well as the electrostatic shields 28, are earthed. A film of indium/tin oxides is thus sputtered on to the lower surface of the substrate 31. The heating effect on the substrate of the plasma in the working space is such that the heating current supply from the low voltage power unit has to be reduced to maintain the substrate temperature constant within ± 10°C of the desired value. An automatic control circuit of known type (not shown) can be used for this purpose.

Since the adjacent cathode strips 271 are connected by link rods 43 to move together with one another, it is not necessary for the pipes 51 which connect them to have any great degree of flexibility. Similarly, in other types of high voltage apparatus in which the components are not moved in relation to a surrounding enclosure, or in which only a small degree of such movement is required, the water pipes and electrical conductors do not require to be flexible, or only require a small degree of flexibility. The alternative arrangement of FIG. 5 is applicable to such cases.

Figure 5:
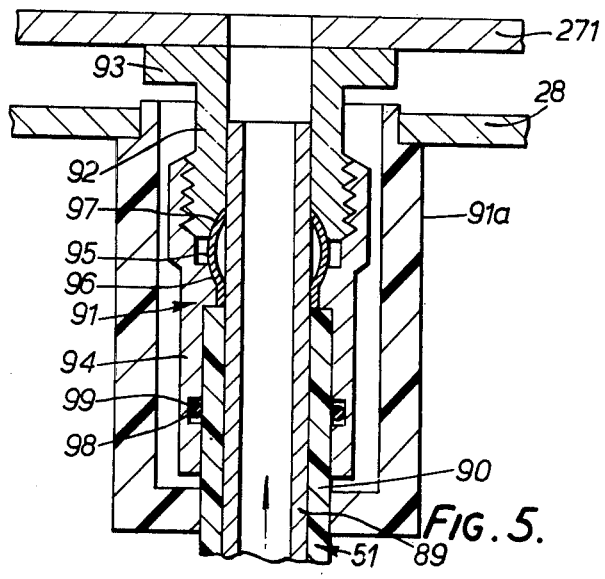
FIG. 5 is a detail cross-sectional view showing an alternative arrangement of water cooling and electrical connections to a cathode strip in the apparatus of FIG. 1.

In the arrangement of FIG. 5, the water supply pipes 51 which connect the adjacent cathode strips 271 are each in the form of a copper tube 89 forming a conductive inner lining fitting tightly within an outer electrically insulating sheath 90 of polyvinychloride. The ends of the pipes 51 are connected with the respective cathode strips 271 by double sealing metal unions 91. Each union 91 comprises a tubular stub member 92 having an end flange 93 through which the stub member 92 is welded to the underside of the cathode strip 271. A double sealing cap nut 94 is screwed on to the stub member 92. At the end of the pipe 51, the sheath 90 is cut away from the copper tube 89. A copper coupling ring 95 of convex annular (i.e. part spherical) form is clamped between an internal part-spherical face 96 in the sealing cap 94 and a part-spherical seating 97 in the bore of the stub member 92 so that the coupling ring 95 seals with the bared end of the copper tube 89. A rubber O ring 98 which fits in an annular groove 99 in the bore of the sealing cap nut 94 seals with the sheath 90 of the pipe 51. In this arrangement, electrical connection between the cathode strips 271 is provided by the copper tubes 89 in the pipes 51.

I claim:

1. A high-voltage, liquid-cooled, vacuum apparatus, said apparatus comprising a wall defining a vacuum chamber, an exhaust connection in said wall to permit evacuation of said vacuum chamber, at least one high-voltage, liquid-cooled component located in said vacuum chamber, a source of high voltage located outside said vacuum chamber, a supply of cooling liquid also located outside said vacuum chamber, an electric conductor which is connected at one end to the said component and at its other end to the said source of high voltage and which passes through said wall of the vacuum chamber, and a cooling liquid supply pipe of electrically insulating material connected at one end to the said component and at its other end to said supply of cooling liquid, and which passes through said wall of the vacuum chamber, said electrical conductor being accommodated within said cooling liquid supply pipe throughout a length thereof extending from the connection of said conductor and pipe to the said component and through said wall of the vacuum chamber, whereby said conductor is completely separated from the vacuum in said chamber.

2. An apparatus according to claim 1 wherein the cross-sectional area of the electrical conductor is substantially less than that of the interior of the liquid supply pipe.

3. An apparatus according to claim 1 wherein the electrical conductor is a metal or wire braid lying loosely in the liquid supply pipe.

4. An apparatus according to claim 1, wherein one end of the liquid supply pipe is connected to the component by means of a metal union and the electrical conductor projects beyond the end of the electrically insulating material of the liquid supply pipe and is connected to a metal part of the union.

5. An apparatus according to claim 4, wherein the union comprises a metal ferrule receiving the said end of the liquid supply pipe and clamped between oppositely facing clamping surfaces provided on a stub member and on a cap nut screw-threaded on the stub member, and the electrical conductor is a metal wire or wire braid lying loosely in the liquid supply pipe and connected to the ferrule by soldering or brazing.

6. An apparatus according to claim 4, wherein the electrical conductor is a metal tube forming a conductive inner lining fitting tightly within an outer electrically insulating sheath of the liquid supply pipe, and the union comprises a metal coupling ring of convex annular (i.e. part spherical) form clamped between oppositely facing clamping surfaces provided on a stub member and on a cap nut screw-threaded on the stub member, so as to cause the coupling ring to make sealing engagement with the portion of the metal tube which projects beyond the end of the electrically insulating sheath of the liquid supply pipe.

7. An apparatus according to claim 6, wherein the end of the electrically insulating sheath of the liquid supply pipe fits tightly within an annular recess in an extension on the cap nut, with the interposition of an "O"-ring seal.

8. An apparatus according to claim 4, wherein the end of the electrically insulating liquid supply pipe remote from the component and outside the vacuum chamber is connected to one end of a double-ended metal union, the other end of which is connected to a further liquid supply pipe connected to said supply of cooling liquid, and the electrical conductor projects beyond the end of the electrically insulating material of the first-mentioned liquid supply pipe and is connected to a metal part of the double-ended union, which is in turn to be connected to the high-voltage source.

* * * * *